United States Patent
Wittig

(10) Patent No.: US 10,187,992 B2
(45) Date of Patent: Jan. 22, 2019

(54) PROTECTIVE HOUSING FOR FLEXIBLE FIXATION OF COMPONENTS AND CIRCUIT BOARD WITH PROTECTIVE HOUSING

(71) Applicant: ZF Friedrichshafen AG, Friedrichshafen (DE)

(72) Inventor: Thomas Wittig, Gesees (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 28 days.

(21) Appl. No.: 15/196,277

(22) Filed: Jun. 29, 2016

(65) Prior Publication Data
US 2017/0013734 A1 Jan. 12, 2017

(30) Foreign Application Priority Data
Jul. 6, 2015 (DE) .................. 10 2015 212 616

(51) Int. Cl.
| H05K 1/18 | (2006.01) |
| H05K 5/00 | (2006.01) |
| H05K 3/30 | (2006.01) |

(52) U.S. Cl.
CPC ............ *H05K 1/18* (2013.01); *H05K 5/0091* (2013.01); *H05K 3/30* (2013.01); *H05K 2201/09063* (2013.01); *H05K 2201/10568* (2013.01); *H05K 2201/10598* (2013.01)

(58) Field of Classification Search
CPC ........ H05K 3/301; H05K 7/12; H05K 5/0047; H05K 5/006; H05K 3/284; H05K 5/0091; H05K 5/0052; H05K 5/0056; H05K 7/20436; H05K 2201/2045; H01L 23/04
See application file for complete search history.

(56) References Cited

U.S. PATENT DOCUMENTS

| 3,458,645 A * | 7/1969 | Braiman ................. H01G 2/04 174/535 |
| 4,730,236 A | 3/1988 | Heinemeyer et al. |
| 6,350,953 B1 | 2/2002 | Franzen |
| 2004/0155308 A1 * | 8/2004 | McFadden ........... H05K 9/0024 257/422 |
| 2005/0068750 A1 * | 3/2005 | Origlia ................. H05K 5/0043 361/752 |
| 2015/0216088 A1 * | 7/2015 | Kawai .................. H05K 1/0203 361/710 |
| 2017/0367199 A1 * | 12/2017 | Hugaud ............... H05K 5/0047 |

FOREIGN PATENT DOCUMENTS

| DE | 4 232 547 C1 | 11/1993 |
| DE | 10 2009 045 915 A1 | 4/2011 |
| DE | 20 2010 017 072 U1 | 7/2011 |

* cited by examiner

*Primary Examiner* — Steven T Sawyer
(74) *Attorney, Agent, or Firm* — Brinks Gilson & Lione

(57) ABSTRACT

The protective housing can cover at least one component on the circuit board; the interior of the cover has several protrusions that are built, so that at least one part is displaced by raising the protective housing on at least one component, so that it is in contact with the exterior contour of the component and fastens it. Moreover, a circuit board is provided with at least one protective housing.

19 Claims, 2 Drawing Sheets

PROTECTIVE HOUSING FOR FLEXIBLE FIXATION OF COMPONENTS AND CIRCUIT BOARD WITH PROTECTIVE HOUSING

PRIORITY STATEMENT

This application claims the benefit of German Patent Application DE 10 2015 212 616.1, file Jul. 6, 2015, and incorporates the German Patent Application by reference herein in its entirety.

FIELD

The present disclosure refers to a flexible mounting of components according to the claims and to a circuit board with protective housing according to the claims.

BACKGROUND

Printed circuit boards are required in the automotive industry for various applications. For example, they are used in a control device for engines or in a transmission control unit and thus they are exposed to great forces and loads. The components arranged on such a circuit board are mounted with various housing forms on the circuit board and they are often very sensitive to vibration loads, oscillations and mechanical shock. Such components have to be protected in an additional process by taking appropriate measures against such loads. Some measures are proposed to ensure increased protection of the circuit board against various influences.

The German utility model DE 20 2010 017 072 U1 presents, for example, a device for holding an electrical component on a circuit board which has a base component for the attachment to the circuit board and a cover part which can be connected to the base component via at least one connecting link. Between the base component and the covering part there is a recess for the mounting of the electrical component. In this recess there is a spring arrangement arranged with two curved springs which are acting on the electrical component that is fixed in the device in order to hold it in a secured manner. By incorporating the electrical component in the recess and by pressing the cover onto the base component, the connecting links are locked in place in the designated areas on the base component. A spring arrangement is provided in order to compensate for the deformation of the electrical component. This spring arrangement clamps the component between the base component and the cover part.

The German patent DE 4 232 547 C1 describes, for example, a device for securing the substrate of an HF-thin-film circuit on the floor of a shielding housing. Pressure pieces that are elastically resistant are provided on the top of the substrate in order to establish a good contact between the substrate rear side and the bottom of the housing. This way, the entire substrate is evenly pressed over several pressure points on the bottom of the housing.

The German patent application DE 10 2009 045 915 A1 proposes the mounting of the circuit board with high tolerance compensation. The circuit board is clamped between two clamping elements which offer elasticity on the side of the circuit board in order to avoid bending and stretching of the circuit board. Oscillations and tolerance deviations are absorbed through the elasticity of the clamping elements.

The German patent application DE 35 29 884 A1 proposes a type of housing for the protection of sensitive components, especially explosives and ammunition against mechanical shock and as an alternative to casting and gluing together housings. The housing body has at least one deformation zone that is parallel to the place of the plastically deformed component that is clamped in the housing. The housing is closed with and elastically deformable cover which presses against the component which presses against the place and this way it offers protection against vibrations and shock.

Furthermore, protection against vibrations, oscillations and shock is often achieved by bonding, grouting and other similar manufacturing steps. For example, this is described in the German patent application DE 199 29 754 C2. One drawback of this method is that grouting tubs might be necessary to define or to limit the expansion of the grouting or of the adhesive. Depending on the application, this is possible with either little of great effort. Therefore, this can result in the need for providing a corresponding place on the circuit board or at the building site in the form of a grouting tub or of a separate frame that is necessary for the spatial limitation. The component which is usually an electronic piece is then introduced into the frame or in the tub and the space between the frame and the tub is filled with flexible casting or adhesive. This mass then wraps around the component and protects it against mechanical stress.

Alternatively, to the grouting tub or to a separate frame, the limitation of the grouting on the circuit board can also be done by a prior application of a so-called glue bead around the component. This hardens quickly so that the actual grouting of the electrical component can be carried out.

In regard to all the methods described above it is necessary to use additional preparatory processes to protect the component. Additionally, the use of grouting tubs complicates or impedes the flexibility of the mounting of the circuit board or the changes of the mounting, as well as the diminution of the circuit board.

However, in the aforementioned methods no mounting method for electric or electronic components is proposed that can offer a simple and flexible, i.e. location-independent possibility for component arrangement while at the same time maintaining the protection of the component. The objective of this disclosure is, therefore, to provide such a way of mounting components. This mounting method for components offers at least the same protection as the known devices, as well as greater flexibility for the placement of the circuit board.

This objective is achieved according to the disclosure through the properties of the patent claims.

SUMMARY

According to the disclosure, a protective housing is proposed which is constructed and formed in order to cover at least one component arranged on the circuit board. What is characteristic of this protection housing are the numerous protrusions that are arranged on the inside of the cover of the protective housing which are formed and constructed such that at least a part of them are displaced by the applying of the protective housing over a component in order to come in contact with the outer contour of the component and to fix it in place. The provision of the flexible or elastic protrusions in the protective housing makes it also possible to cover different components on a circuit board using the same housing, as well as to adapt the protrusions when covering the component by selection the appropriate geometric shape and the material of the protrusions of the form of the components. Further achievement is obtained by the embedding in the protrusions which dampens the mechanical stress such as oscillations and vibrations and the components are therefore protected. Moreover, this protective housing which is made according to the disclosure has the advantage that there is no need for any complicated grouting process with rigidly arranged circuit boards and grouting tubs and also the placement and the modification of the placement of the circuit board is much more flexible compared to the other known protective measures. Especially advantageous is the protective housing for the protection of electronic components since they are very sensitive to mechanical stress.

Advantageously, the protrusions have the same geometric shape. This enables a mass production of housings and a uniform arrangement of the protrusions. The geometric shape of the protrusions is not limited. Rather they can have a suitable shape that is appropriate for the respective application or component. For example, the protrusions can be cone shaped (truncated) or cup shaped or they can have other suitable shapes as long as they are flexible and resistant and can be displaced by the components.

Furthermore, there is another advantage when the protrusions are arranged in the form of a grid. By arranging them in the form of a grid, the protrusions are placed at a defined distance from one another and they form gaps everywhere, so that any component of any shape can be used and for any component there is a corresponding protrusions for displacement and mounting.

Additionally, a spacer can be arranged between each of the protrusions in order to stabilize them and to define the maximum possible displacement. The spacer is preferably attached to the lid and it allows the usage of very flexible and elastic materials to be used for the protrusions so that these will be kept in place by the spacer. The height of the spacer is selected so that the component is completely covered by the protective housing. It is preferable that the height of the spacer is selected so that there is a gap left between the components which are immersed in the protrusions and the spacer. This way, the protrusions can be bent up to the beginning of the spacer and then stabilized by it. Thus, the spacer serves to add additional stabilization and mounting for the component.

Also, the temperature compensation with the outside can be made through the recess in order to dissipate the heat that is generated by the components located inside the protective housing. Furthermore, this disclosure provides that the protective housing has at least one recess on at least on side thereof. This one recess can be used as a slit or semi-circle or as a hole in the wall of the protective housing. The recess serves to allow pressure equalization between the interior and the exterior of the protective housing. This can occur for example because of temperature variations.

These attachment areas are chosen depending on the design and the mounting type of the protective housing. For example, the protective housing can be mounted on the circuit board on which the components are arranged. For this purpose, fasteners are attached to the side of the housing which is mounted on the circuit board. These can be designed differently. If the circuit board has pre-drilled holes on it, the fasteners on the protective housing can be attached in form of pins which are locked by clicking them into holes of the circuit board without any need for additional mounting. Screw fastening can also be provided which are applicable for different circuit board thickness.

Alternatively, for the fastening of the protective housing on the circuit board these can also be attached on a housing which accepts circuit boards. For this purpose, the attachment areas are preferably arranged on the side of the cover of the protective housing. Basically any suitable type of mounting method can be used for the protective housing, as long as the protective housing covers the components and is firmly fixed on the circuit board or on the housing.

In order to connect more protective housings with one another and thus protect more components at the same time, there are more contours arranged on the exterior of the protective housing. These contours are specially made so that they can be connected with the adjacent contour of the protective housing. The choice of form for the contours depends on the form and the material of the protective housing, as well as on the developer's production facilities, and the guidelines respectively. By connecting more protective housings one can protect more components on the circuit board at the same time. Furthermore, within the framework of the present disclosure there is one circuit board that is assembled with at least one component, where at least one of the components is covered with one of the protective housings described above. In one of the models the protective housing is attached to the circuit board. Additionally, it is provided that more protective housings are to be connected with one another with the help of the contours that are to be found on the exterior.

The protective housing accomplished according to the present disclosure saves space on the circuit board and allows a flexible parts assembly of the circuit board, because there is no need for a prefabricated tub or a placeholder. Moreover, one can reduce costs, because there is no need for grouting materials, grouting installations and curing ovens.

Further features and advantages of the disclosure arise as a result from the following description of the disclosure's design examples, by reference to figures of the drawing, to the details accomplished according to the present disclosure and to the standard. The individual features can be achieved each one for itself or for more in an arbitrary combination for one version of the disclosure.

BRIEF DESCRIPTION OF THE DRAWINGS

The preferred designs of the disclosure are to be presented in detail with the help of the attached sketches. It shows.

DETAILED DESCRIPTION OF EXAMPLE EMBODIMENTS

In the following descriptions of the figures there were used the same elements and the same functions with the same reference symbol.

Figure 1:
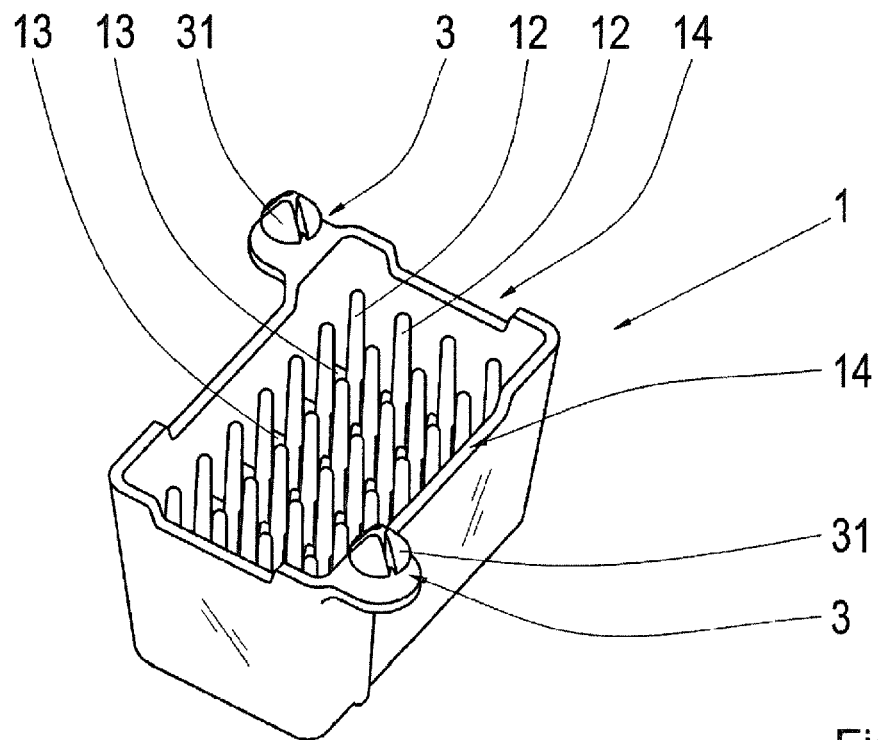
FIG. 1 A bottom view of one protective housing accomplished according to the present disclosure, presented with the help of a design example of the present disclosure.

FIG. 1 shows a bottom view of the protective housing 1 accomplished according to the present disclosure, presented with the help of a design example of the present disclosure. The protective housing 1 is in this case a rectangular housing with two fastening areas 3, which are faced diagonally. The fastening areas have fastening elements 31, which are used for fixing to the circuit board 4. The fastening elements 31 are fixed in the circuit board 4 with the help of a pre-drilled hole and due to their form they are locked in place on the back of the circuit board 4. Furthermore, the fastening elements 31 have in this design a recess, with the help of which one can fasten the fastening elements 31 tight using a screwdriver, in order to assure a better connection with the circuit board. Inside the protective housing 1 there are protrusions 12, which have the same geometrical form; in this case a cone shape and which are arranged in a grid. In order to build the grid, there are bar spacers 13, fixed between the protrusions 12 and at the cover 11 (in FIG. 1). The bar spacers 13 can also be used in order to stiffen the area of the protrusions 12, that is fixed to the cover 11, so that the top of the protrusions 12 of the contour match the components 2, but so that the protrusions can keep a rigidity at the same time, in order to be able to fasten the components 2.

Figure 2:
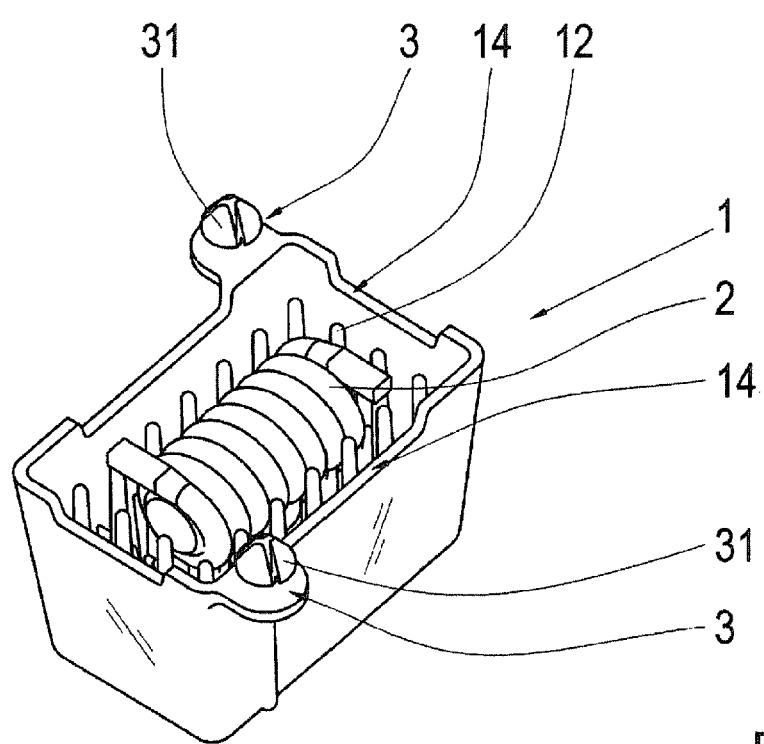
FIG. 2 A bottom view of the protective housing presented in FIG. 1 with the components that are to be found there, with the help of a design example of the present disclosure.

The FIG. 2 shows a bottom view of the protective housing 1 presented with the components 2 that are to be found there, with the help of a design example of the present disclosure. By fixing the protective housing 1 on the component 2 that can be an electronic component, the protrusions 12 are displaced, because they are made of a flexible and an elastic material, so that the component 2 can enter in the interior of the protective housing and be fastened at the same time.

Figure 3:
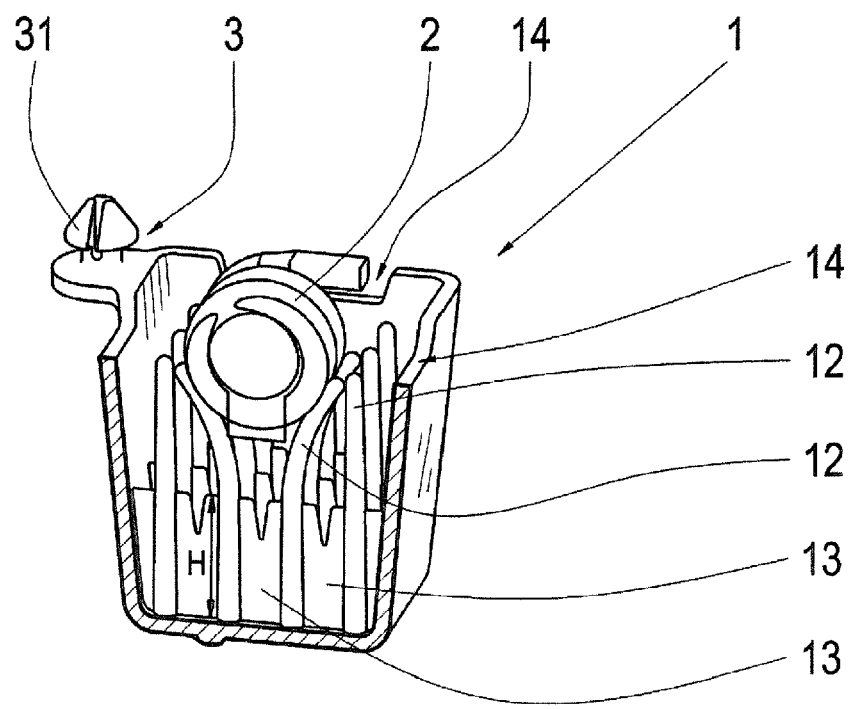
FIG. 3 A sectional view of the appropriate protective housing presented in FIG. 2 with the components that are to be found there, with the help of a design example of the present disclosure.

The displacement is clearly presented in FIG. 3 that represents a sectional view of FIG. 2. Furthermore, in FIG. 3 one can recognize the bar spacers 13 between the protrusions 12 used to create a grid. The bar spacers 12 are to be found on the cover 11 in the protective housing 1 and must have a height H, that can assure that the component 2 is completely covered by the protective housing 1. As one can see in the FIGS. 2 and 3, the component 2 displaces the protrusions 12 in a way that they cling on the component 2 and create a pressure, because they try to go back to their initial place. Thanks to this feature, the component 2 is embedded in the protective housing 1, that the vibrations or the mechanical stress have a very little influence, because they are damped with the help of the protrusions 12. On the other hand, the component 2 will be fastened in the protective housing.

Both in the FIG. 1 and in the FIGS. 2 and 3 the recesses 14 are represented at the protective housing 1 on the side that is to be mounted on the circuit board 4. They are used for pressure compensation and as air vent slot.

Figure 4:
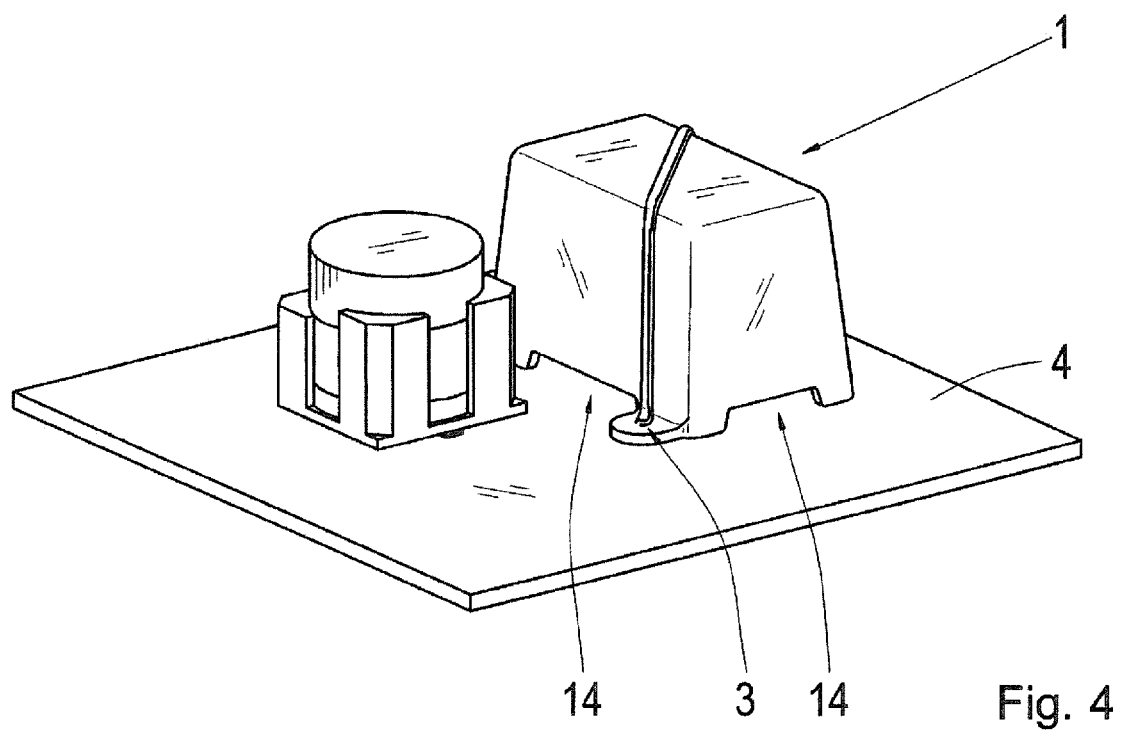
FIG. 4 A schematic view of a circuit board with the attached protective housing, with the help of a design example of the present disclosure.

FIG. 4 shows a schematic view of a circuit board 4 with the attached protective housing 1 with the help of a design example of the present disclosure. The presented circuit board 4 comprises the disposed components; out of these components only one is covered with the protective housing. The protective housing 1 uses only little space and in this design it is attached to the circuit board using the fastening elements 31 (invisible here) on the fastening area 3. The fastening elements 31 are fastened to the circuit board 4 through holes and are caught at the bottom, so that the protective housing can be fixed to the circuit board 4. Furthermore, one can see recesses 14 on the protective housing, which are used for pressure compensation and as air vent slot, for example in order to discharge the generated heat out of the protective housing with the help of an element. With the help of the present disclosure one can accomplish a simple and flexible fixation of the components that does not require additional sophisticated production steps. With the help of the flexible and elastic protrusions one can protect in a simple way all the components and elements that are sensitive against mechanical stress and vibrations; at the same time the fixation of the elements and the components takes place. The protective housing enables a more flexible mounting of the circuit board. Additionally, it facilitates changes at the mounted circuit boards, because one must adjust only the fastening type for the circuit board or at the housing for the protective housing.

REFERENCE SYMBOLS

1 Protective housing
11 Cover of the protective housing
12 Protrusions
13 Bar spacer
14 Recesses, resp. spaces for air vent
2 Components, electronic elements
3 Fastening area
31 Fastening element
4 Circuit board
H Height of the spacer

The invention claimed is:

1. A protective housing for covering at least one of the components on a circuit board, comprising:
a lid; and
a plurality of protrusions fixed directly to an interior of the lid, wherein at least some of the plurality of protrusions are configured to be displaced when the protective housing covers the component and when at least some of the plurality of protrusions are in contact with an exterior contour of the component,
wherein the plurality of protrusions are separated by a bar spacer, wherein the bar spacer is a strip that extends into a space between the plurality of protrusions.

2. The protective housing according to claim 1, wherein the plurality of protrusions have the same geometrical form.

3. The protective housing according to claim 1, wherein the plurality of protrusions are arranged in a uniformly spaced grid.

4. The protective housing according to claim 1, further comprising at least one air vent on a side of the protective housing.

5. The protective housing according to claim 1, further comprising at least two fastening areas.

6. The protective housing according to claim 1, wherein on an exterior of the protective housing there are contours.

7. A circuit board comprising:
at least one component;
a protective housing comprising:
a lid; and
a plurality of protrusions fixed directly to an interior of the lid, wherein at least some of the plurality of protrusions are configured to be displaced when the protective housing covers the at least one component and when at least some of the plurality of protrusions are in contact with an exterior contour of the at least one component,
wherein the plurality of protrusions are separated by a bar spacer, wherein the bar spacer is a strip that extends into a space between the plurality of protrusions.

8. The circuit board according to claim 7, wherein the protective housing is fixed on the circuit board.

9. The circuit board according to claim 7, wherein a plurality of protective housings can be connected through contours that are found on the exterior of the protective housing.

10. The protective housing according to claim 1, wherein the plurality of protrusions are elastically deformable.

11. The protective housing according to claim 1, wherein the plurality of protrusions are adaptable to cover different components by selecting a shape or a material for the plurality of protrusions.

12. The protective housing according to claim 1, wherein the plurality of protrusions are displaced by the component.

13. The protective housing according to claim 1, wherein the bar spacer has a height that is shorter than a height of the plurality of protrusions, and wherein the plurality of protrusions are configured to be bent up to a top of the bar spacer.

14. The protective housing according to claim 1, wherein the bar spacer limits the displacement of the plurality of protrusions.

15. The protective housing according to claim 14, wherein the bar spacer is configured to have a height such that the component is completely covered by the protective housing when the protective housing is attached to the circuit board.

16. The protective housing according to claim 1, wherein the bar spacer is configured to have a height such there is a gap between a top of the bar spacer and the component when the protective housing is attached to the circuit board.

17. The protective housing according to claim 5, wherein the at least two fastening areas comprise vertical projections configured to enter correspondingly shaped holes on the circuit board.

18. The protective housing according to claim 17, wherein the vertical projections are configured to be locked into the circuit board.

19. A protective housing for covering at least one of the components on a circuit board, comprising:
- a lid; and
- a plurality of protrusions fixed directly to an interior of the lid, wherein at least some of the plurality of protrusions are configured to be displaced when the protective housing covers the component and when at least some of the plurality of protrusions are in contact with an exterior contour of the component,
- wherein on an exterior of the protective housing there are contours, wherein the contours are configured to be removably connected to contours on adjacent protective housings.

* * * * *